United States Patent [19]

Sato et al.

[11] Patent Number: 5,051,397
[45] Date of Patent: Sep. 24, 1991

[54] JOINED BODY OF HIGH-TEMPERATURE OXIDE SUPERCONDUCTOR AND METHOD OF JOINING OXIDE SUPERCONDUCTORS

[75] Inventors: Chie Sato; Masahiko Sakamoto, both of Hitachi; Hisanori Okamura, Ibaraki; Takao Funamoto, Hitachi; Masahiro Ogihara, Katsuta, all of Japan

[73] Assignee: Hitachi, Ltd., Tokyo, Japan

[21] Appl. No.: 438,096

[22] Filed: Nov. 20, 1989

[30] Foreign Application Priority Data

Nov. 25, 1988 [JP] Japan .................................. 63-296069

[51] Int. Cl.⁵ .................................................. B32B 9/00
[52] U.S. Cl. .......................................... 505/1; 505/701; 505/702; 505/703; 505/704; 428/426; 428/432; 428/433; 428/688; 428/698; 428/901; 428/930
[58] Field of Search ......................... 505/1, 701-704; 428/688, 698, 901, 930, 426, 432, 433

[56] References Cited

U.S. PATENT DOCUMENTS 4,870,051 9/1989 Maxfield et al. ............... 204/15
4,879,270 11/1989 Maxfield et al. ............... 204/15

FOREIGN PATENT DOCUMENTS 190713 8/1988 Japan ..

OTHER PUBLICATIONS

Zis–Mitteilungen, vol. 29, No. 4, Apr. 1987, W. John, "Herstellungsverfahren und Verfahreh von Lotpasten fur die Electronik", pp. 401–404 and English translation.
Applied Physics Letters, vol. 52, No. 4, Jan. 1988, J. E. Ekin, et al. "Method for Making Low-Resistivity Contacts to High Tc Superconductors", pp. 331–333.
Cryogenics, vol. 27, Aug. 1987, P. Bruzzone, "Electrical Properties of Low Melting Point alloys at 4.2 K", pp. 433–436.

*Primary Examiner*—Patrick J. Ryan
*Attorney, Agent, or Firm*—Antonelli, Terry, Stout & Kraus

[57] ABSTRACT

The present invention provides a method for joining of high-temperature oxide superconductors per se or a high-temperature oxide superconductor and other conductive material through a very simple process. According to this method, the joining is carried out by using an alloy comprising 0.1%–90% by weight of at least one divalent metallic element and the balance as a brazing material and heating and melting the brazing material. The resulting joined body has a joint low in resistance. The divalent metallic element of the alloy is preferably an element of Group IIA or IIB of the Periodic Table or a transition metal.

7 Claims, 4 Drawing Sheets

F I G. 1
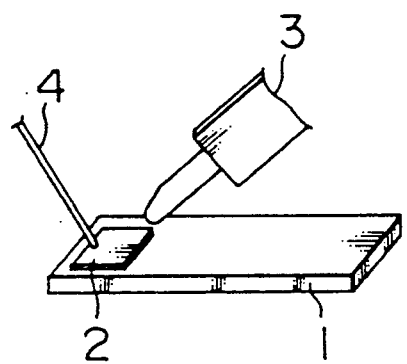
F I G. 2
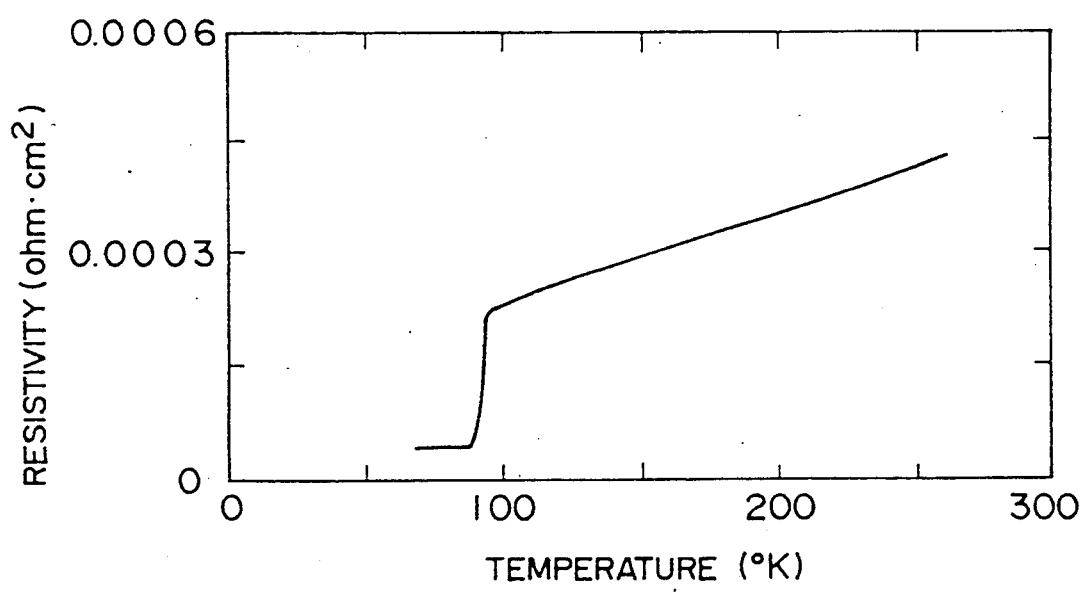

JOINED BODY OF HIGH-TEMPERATURE OXIDE SUPERCONDUCTOR AND METHOD OF JOINING OXIDE SUPERCONDUCTORS

BACKGROUND OF THE INVENTION

The present invention relates to a method for joining high-temperature oxide superconductors, a brazing material for joining and a superconductor body joined thereby and in particular to a method for joining of high-temperature oxide superconductors which is very simple in steps and can provide a joined body small in resistance of the joint and various apparatuses using the joined body.

DESCRIPTION OF RELATED ART

Joining of superconductors is a functional joining which requires that superconductor characteristics be not lost by joining and resistance of the joint at the temperature of liquid nitrogen be as close to 0 as possible.

At present, joining of high-temperature oxide superconductors is mainly for connection of terminals in evaluation of superconductor characteristics.

Hitherto, as the joining method which has been generally employed, it is known to solder the superconductors with indium under application of ultrasonic, but this method has the practical problem that contact resistance is great. It is necessary to reduce the contact resistance to such an extent that at least heat developed by contact resistance is smaller than heat dissipated. On the other hand, the method as mentioned in Appl. Phys. Lett. 52 (21) pp 1819-1821 (1988) which comprises subjecting the superconductors to sputter etching with Ar ion and then to vapor deposition of a noble metal and setting terminals thereon by wire bonding can considerably reduce contact resistance to $10^{-10} \Omega \cdot cm^2$. However, this method imposes limitations in size of bodies to be joined and the connection of a lead wire and the scope of application of this method is also limited. Considering joining of high-temperature oxide superconductors for various applications thereof, development of the joining method which has no limitations in shape, size and material of bodies to be joined has been demanded. Especially when considering application to a superconductor magnet, it is essential to reduce contact resistance as much as possible in order to enhance stability by omitting quenching against heat developed due to resistance and besides, in order to make current decay as small as possible in case of using with mode of permanent current.

The above conventional techniques suffer from the problems that in case of soldering with indium which is a simple method, contact resistance is high and in case of a vapor deposition method, contact resistance is low, but materials which can be joined with high-temperature oxide superconductors are limited and thus this method is not suitable for joining with various materials aiming at various uses.

SUMMARY OF THE INVENTION

The object of the present invention is to provide a method for joining high-temperature oxide superconductors which has solved the above-mentioned problems in conventional techniques and which is simple in joining steps and can reduce contact resistance and can provide wide uses.

BRIEF DESCRIPTION OF THE DRAWINGS

FIG. 1 is a picture which shows an embodiment of Example 1.

FIG. 2 is a graph which shows the dependence of temperature versus contact resistivity of joint in one example of the present invention.

DETAILED DESCRIPTION OF PREFERRED EMBODIMENTS

Figure 3:
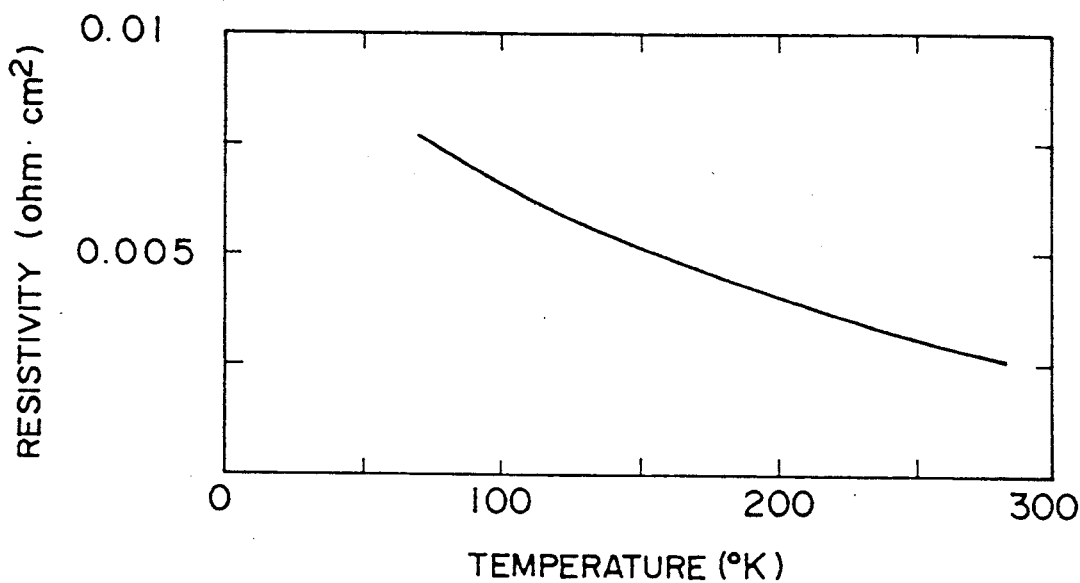
FIG. 3 is a graph which shows the dependence of temperature-resistivity of a joint when the joint was made using indium.

The above object has been attained by using an alloy comprising indium hitherto used and 0.1-90 wt. % of at least one element selected from divalent metallic elements of Groups IIA, IIB and etc. of the Periodic Table.

That is, the present invention provides a method for joining high-temperature oxide superconductors, characterized by carrying out the joining by heating and melting, at a low temperature of 150°-350° C., a brazing material which is an alloy which comprises 0.1-90 wt. % of at least one element selected from metallic elements in a stable divalent state and the balance of indium.

The heating and melting is preferably carried out by bringing an ultrasonic iron heated to a predetermined temperature into contact with the brazing material. The frequency of the ultrasonic iron is preferably in the range of 10-100 kHz. Moreover, the output is preferably in the range of 10-1,000 W. The ultrasonic vibration is applied to the brazing material to obtain a high joining strength of the brazing material to the oxide.

Furthermore, the present invention provides a brazing material for joining high-temperature oxide superconductors which comprises 0.1-90 wt. % of at least one metallic element in a stable divalent state and the balance of indium and has a melting point of 100°-300° C.

Moreover, the present invention provides a high-temperature oxide superconductor body which comprises high-temperature oxide superconductors, which are joined to each other by the above joining method; a high-temperature oxide superconductor and other conductor material which are joined by the above joining method; and a high-temperature oxide superconductor on the surface of which the above-mentioned brazing material for joining is present in contact with the surface.

Next, the present invention will be explained in detail.

Suitable metallic elements of a stable valence of +2 include, for example, metals having a valence of +2 such as those of Groups IIA and IIB of the Periodic Table and transition metal elements in a stable state of valence of $+2$.

As the metallic elements of Group IIA is preferred at least one element selected from Ca, Mg and Sr. As the metallic elements of Group IIB is preferred at least one element selected from Zn and Cd. As the transition metal elements stable in state of valence of $+2$, are preferred Mn, Fe, Co and Ni, and especially is preferred Ni. It is especially effective to use Cd in an amount of 5-75 wt. %. The amount of Zn is in the range of 1-40 wt. %, preferably 2-20 wt. %.

The present invention can be applied to all of known oxide superconductors, and examples thereof are lanthanum type, yttrium type, thallium type and bismuth type high-temperature oxide superconductors.

The superconducting oxides used in the present invention may be a perovskite oxide having a structure of $ABO_3$, wherein A is Ba, Pb, La, Pr or Nd, B is Cu, Mg, Mn, Fe, Co or Ni, or $A_{1-x}A'_xBO_3$, wherein A and B are the same as defined above, and A' is Ca, Ba, Sr or Pb, such as $BaPb_{1-x}Bi_xO_3$, $BaPbO_3$, $LaCuO_3$, $LaCoO_3$, $(La_{1-x}Sr_x)CoO_3$, $(La_{1-x}Sr_x)CrO_3$, $(La_{1-x}Sr_x)CrO_{3-\delta}$ or $SrFeO_3$; a layer perovskite oxide has a structure of $A_2BO_4$, wherein A is a rare earth metal and B is a transition metal, such as $La_2CuO_4$ or $La_2NiO_4$, or $A_{2(1-x)}A'_{2x}BO_4$, wherein A and A' are elements of Group IIIB and Group IIA of the Periodic Table, respectively, and B is a transition metal, such as $(La_{1-x}Sr_x)_2CuO_4$, $(La_{1-x}Ba_x)_2CuO_4$, $(Y_{1-x}Ba_x)_2CuO_4$, $(Y_{1-x}Sr_x)$ or $(Sc_{1-x}Sr_x)_2CuO_4$; an oxygen-difficient perovskite layer oxide has a structure of $AB_2C_3O_{7-x}$, wherein A is Y, La, Nd, Dy, Sm, Eu, Gd, Ho, Er, Tm or Yb, B is Ba, Sr, Ca or Sc and C is mainly Cu, $YBa_2Cu_3O_{7-x}$, $LnBa_2Cu_3O_{7-x}$, wherein Ln is a lanthanoid as indicated above, $YSr_2Cu_3O_{7-x}$, $YBa_2Cu_{3-x}Ni_xO_{7-y}$, $YBa_2Cu_{3-x}Ag_xO_{7-y}$, $YBaCaCu_3O_{7-x}$, $Y_{0.75}Sc_{0.25}Ba_2Cu_3O_{7-x}$ or $YBa_2Cu_3F_2O_y$; a multilayer perovskite oxide has a structure of $A_2(B,C)_3D_{2+x}O_8$, wherein A is Bi or Tl, B is Ba or Sr, C is Ca and D is Cu, such as $Bi_4Sr_3Ca_3Cu_{4+x}O_{16}$ or $Tl_4Ba_2Ca_2Cu_{4+x}O_{16}$; and a spinel oxide has a structure of $AB_2O_4$, wherein A is Li and B is Ti, such as $LiTi_2O_4$.

The present invention can be applied to joining of superconductors of any shapes, but at present is applied mainly to joining of superconductor wire materials. Furthermore, the characteristics of superconductors are measured and evaluated by joining terminals to superconductors according to the present invention.

Preferred compositions of the brazing material of the present invention are as follows. In base alloys containing 15% by weight or less of Zn; In base alloys containing at least one of Mn, Fe, Co, Ni, Cr, Cu and Pd in an amount of 0.5-5% by weight for one element and in an amount of totally - 7.5% by weight for two or more elements; preferably 0.5-2% by weight for a single element except for Cu and 1-3% by weight for two or more; and In base alloys containing at least one of Ca, Mg and Sr in an amount of 1-7% by weight for one element and in an amount of totally 2-10% by weight for two or more elements. Especially preferably, the content of Zn is 3-10% by weight, the content of one or two or more of Mn, Fe, Ni, and Co is 0.5-1.5% by weight, and the content of one or two or more of Ca, Mg and Sr is 1-5% by weight.

The present invention uses an alloy comprising 0.1-90% by weight of at least one element selected from metallic elements having a stable valence of $+2$ and the balance of In as a brazing material for joining high-temperature oxide superconductors. Use of this brazing material makes it possible to obtain a joined body low in contact resistance between the superconductor and the brazing material.

When In simple substance is used as a brazing material for joining of superconductors as in conventional techniques, softness, adherence and processability of In are advantageous for wetting, but there is the defect of high contact resistance. It is presumed that this is because an oxide of indium is produced at the interface of joining with the superconductor and this reaction product acts as a high resistance layer. It is considered that when the above metal is added to In, a crystal structure where a part of indium is replaced with this metal is obtained at the time of the indium oxide being formed, whereby the indium oxide which is inherently a semiconductor close to an insulating material comes to have a higher electrical conductivity due to the effect of impurity. Indium is in the state of $+3$ in valence and so a metal having a valence of $+2$ is suitable for formation of an impurity level. The similar effect is expected also when a metal having a valence of $+4$ is added, but reduction of contact resistance has not been recognized when an In base alloy containing Sn, Pb, or the like is used. It is also considered that elements having a valence of $+2$ are advantageous for having some interaction with high-temperature oxide superconductors including $YBa_2Cu_3O_{7-\delta}$ when the constituting elements other than oxygen are in the states of $+2$ and $+3$ in valence.

Melting point of the In base alloy used here can be adjusted to 300° C. or lower by proper selection of a proportion of elements added and thus joining at a relatively low temperature is possible and hence the characteristics of a superconductor is not damaged by heating at joining. Furthermore, for the above-mentioned reasons, the step for joining is very simple and besides there are nearly no limitations in the shape and size of bodies to be joined.

For the reasons that joining is conducted at a lower temperature (the melting point of an alloy used should be 100°-300° C., considering that the brazing temperature is higher than the melting point by about 50° C. and that a melting point of lower than 100° C. causes problems in joining ability) and that the characteristics of In should be retained, it is proper to select proportion of metals to be added within the range of 0.1-90% by weight depending on respective metallic elements. If the amount of the metal is less than 0.1% by weight, the effect of addition cannot be recognized owing to too small a addition amount and if it is more than 90% by weight, the melting point of the alloy increases and besides wettability to superconductor is very poor.

According to the present invention, in the case of joining between a high-temperature oxide superconductor and other material, the joint has a very low contact resistivity of less than several ten $\mu\Omega\cdot cm^2$ and besides joining can be accomplished through the very simple step. Since there are no limitation in size and shape of samples to be joined and in addition, joining can be performed at a low temperature, the present invention can be applied to joining of high-temperature oxide superconductors per se and joining of the superconductor with metals or other ceramics and thus the present method has a wider scope of applications than conventional low resistance joining methods.

Moreover, in the present invention, development of heat due to contact resistance is controlled to a lower level and so applicable current value increases in case of superconductor magnet used in magnets for a high magnetic field, MRI and the like and stability of the magnets is also improved. Furthermore, the present method makes it possible to obtain measured values close to the true value in evaluation of characteristics of superconductors such as Jc value.

The present invention will be illustrated in detail by the following examples.

EXAMPLE 1

One example of the present invention is explained in comparison with a conventional example.

As shown in FIG. 1, a 75 wt. % In - 25 wt. % Cd alloy 2 was placed on a strip-like $YBa_2Cu_3O_{7-\delta}$ superconductor 1 of 15 mm in length, 4 mm in width and 1 mm in thickness and the superconductor was brazed with a copper wire 4 by heating and melting the solder by bringing the solder into contact with an ultrasonically vibrating iron 3 heated to 180° C. under application of untrasonic wave. The brazing thickness was about 1 mm. Thus, a joined body of $YBa_2Cu_3O_{7-\delta}$ and a metal was obtained. Joining with clean metal surface was obtained by application of ultrasonic wave to the soldering iron.

Resistance of the joint was measured to obtain a temperature-resistivity curve as shown in FIG. 2. Joining was conducted in the same manner as above using In which has been hitherto used and contact resistance was measured. The results are shown in FIG. 3. Comparison of these results shows that the curve of FIG. 3 shows the behavior like semiconductor, namely, contact resistance increased with decrease in temperature and resistivity at 77° K. was 7400 $\mu\Omega \cdot cm^2$ while the curve of FIG. 2 of the present invention shows nearly the same behavior as of resistance curve of superconductor and resistivity at 77° K. was 37.5 $\mu\Omega \cdot cm^2$.

That is, according to this Example, a joined body in which resistance of joint of superconductor is low can be very easily obtained. The contact resistivity was able to be reduced to about 1/200 of resistivity when joining was conducted using In.

EXAMPLE 2

A 98 wt. % In-2 wt. % Zn alloy was placed on a $YBa_2Cu_3O_{7-\delta}$ superconductor of 15 mm in length, 4 mm in width and 1 mm in thickness and brazing of the superconductor with a copper wire was carried out by heating to 200° C. under application of ultrasonic. Contact resistance of the resulting joined body was measured to find that temperature-resistivity curve showed the same behavior as temperature-resistivity curve of superconductor as in Example 1 and contact resistivity at 77° K. was 80.2 $\mu\Omega \cdot cm^2$.

EXAMPLE 3

Figure 4:
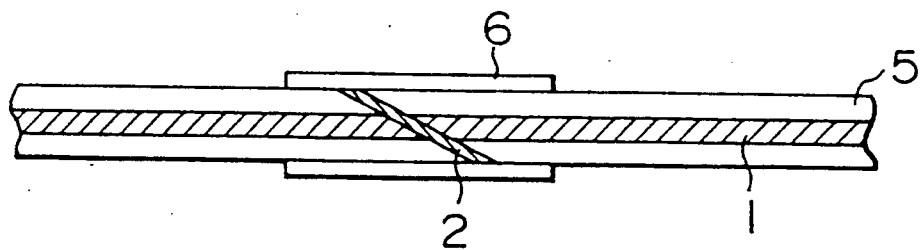
FIGS. 4 and 5 are schematical cross-sectional views of embodiments of Examples 3 and 4.

As shown in FIG. 4, two ribbon-like wire materials 1 (with Ag sheath) of $YBa_2Cu_3O_{7-\delta}$ of 100 mm in length, 7 mm in width and 0.1 mm in thickness were butted at their cross-sections obliquely cut and a 75 wt. % In-25 wt. % Cd alloy foil 2 was inserted between these two wire materials. Furthermore, the above indium alloy 6 or indium 6 was placed in such a manner that it sandwiched the butted portion from both sides and the materials were joined by heating to 180° C. At the time when the brazing material was molten, a slight pressure was applied to increase adherence. In this way, a joined body of the superconductors per se was obtained. Critical current density of this joined wire was measured to obtain Jc=740 $A/cm^2$. Critical current density of the ribbon-like material before joining was Jc=800 $A/cm^2$ and it was seen that reduction of Jc due to joining was small.

A superconductor coil was made from this joined wire. Furthermore, a superconductor magnet was made using this coil. A stable magnet was obtained with nearly the same characteristics as those of magnet made of a coil which had no joint. This superconductor magnet can be applied to linear car (i.e., magnetically levitated car), accelerator, power storage, and so on.

The oxide superconductor wire obtained by joining with the brazing material of the present invention can be used as a coil for a rotor and stator of a rotator, coil for storage of energy, coil for a magnet of a nuclear fusion apparatus, cable for power transmission and distribution, coil for a transformer, coil for an accelerator, coil for a magnet of MRI and NMR, coil for an electron microscope, coil for a magnet of an atomic absorption spectrometer, coil for a rotor and stator of an electric motor of a tram car, automobile, elevator, and escalator and coil for a magnet of a magnetically levitated car.

EXAMPLE 4

Figure 5:
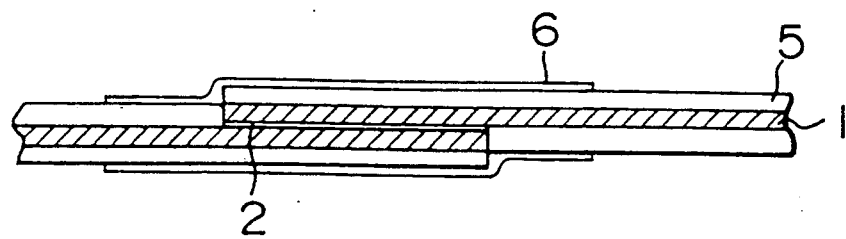

FIG. 5 shows a joint on both exposed end flat areas from which the sheaths were removed, while the joint was made at the ends in Example 3. The joining was carried out in the same manner as in Example 3. The procedures has such merits that the joint can be made on a greater area.

EXAMPLE 5

As shown in Example 4, the end of a superconductor wire was exposed by removing a sheath and a copper wire was connected to the exposed end.

A 99 wt. % In-1 wt. % Ni alloy was placed at the end cross-section part of a ribbon-like material (with Ag sheath) of $YBa_2Cu_3O_{7-\delta}$ of 100 mm in length, 7 mm in width and 0.1 mm in thickness and this was brazed with a copper wire by heating the alloy to 180° C. under application of ultrasonic. Thus, joined body of a $YBa_2Cu_3O_{7-\delta}$ super conductor wire material and a metallic wire was obtained. Critical current density of this joined body was measured to find that Jc value was nearly the same as that of the superconductor material before joining as in Example 3 and that there is no possibility of breakage of superconduction owing to resistance at the joint.

EXAMPLE 6

Figure 6:
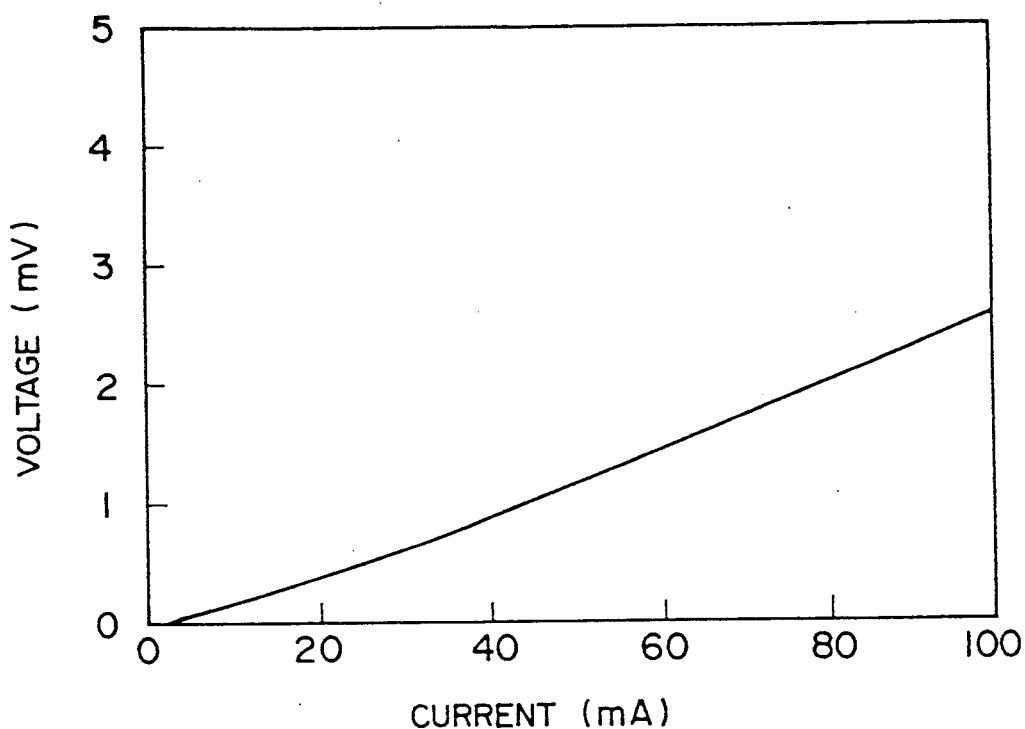
FIG. 6 is a graph which shows the dependence of current-voltage of a joint in one example of the present invention.
Figure 7:
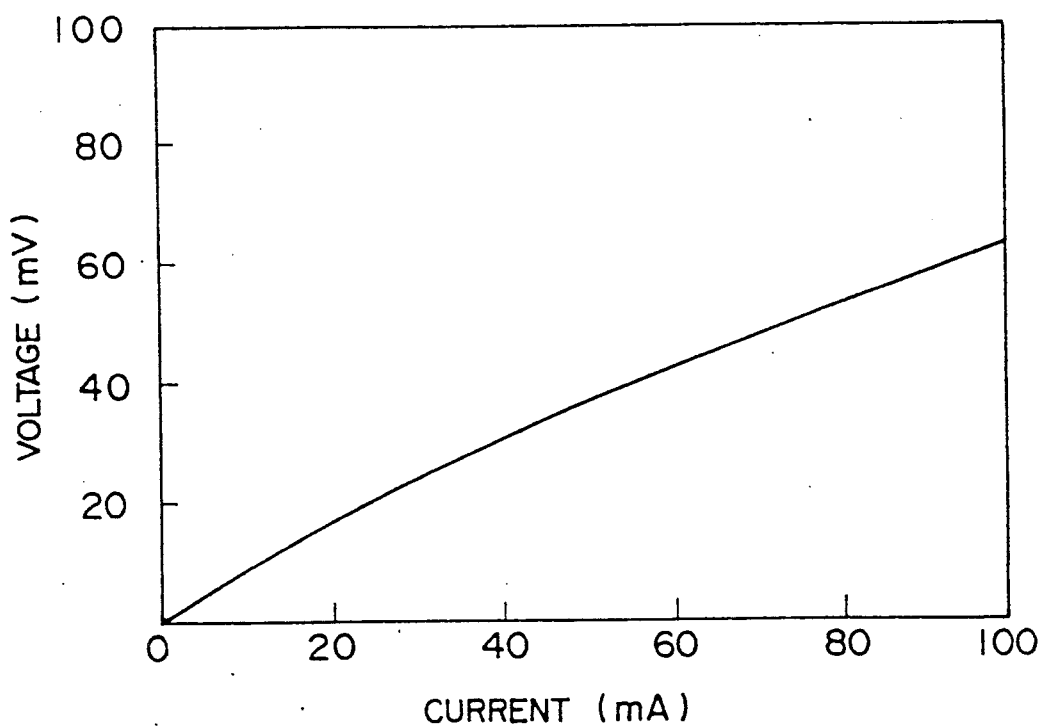
FIG. 7 is a graph which shows the dependence of current-voltage of a joint when joining was conducted using indium.

A 75 wt. % In-25 wt. % Cd alloy was placed on a strip-like $Bi_2Sr_2Ca_2Cu_3O_x$ superconductor of 15 mm in length, 4 mm in width and 1 mm in thickness and this superconductor was brazed with a copper wire by heating to 180° C. under application of ultrasonic in the same manner as in Example 1. Joint area was 4 $mm^2$ and brazing thickness was about 1 mm. Thus, a joined body of $Bi_2Sr_2Ca_2Cu_3O_x$ superconductor and a metal was obtained. Current-voltage characteristics (hereinafter referred to as "V-I characteristics") of the joint at 77° K. and contact resistance were measured to obtain a current-voltage curve as shown in FIG. 6. For comparison, similar joining was conducted using In and V-I characteristics were measured. The results are shown in FIG. 7. In FIG. 7, the curve is upwardly convex and shows behavior of semiconductor which deviates from Ohm's low according to which current and voltage are in proportion and resistivity at 77° K. was 32,100

$\mu\Omega\cdot cm^2$. On the other hand, as can be seen from FIG. 6, when the method of the present invention was employed, the curve is downwardly convex, namely, a curve of superconductor and resistivity at 77° K. was 300 $\mu\Omega\cdot cm^2$, which was about 1/100 of the resistivity when In was used.

EXAMPLE 7

Figure 8:
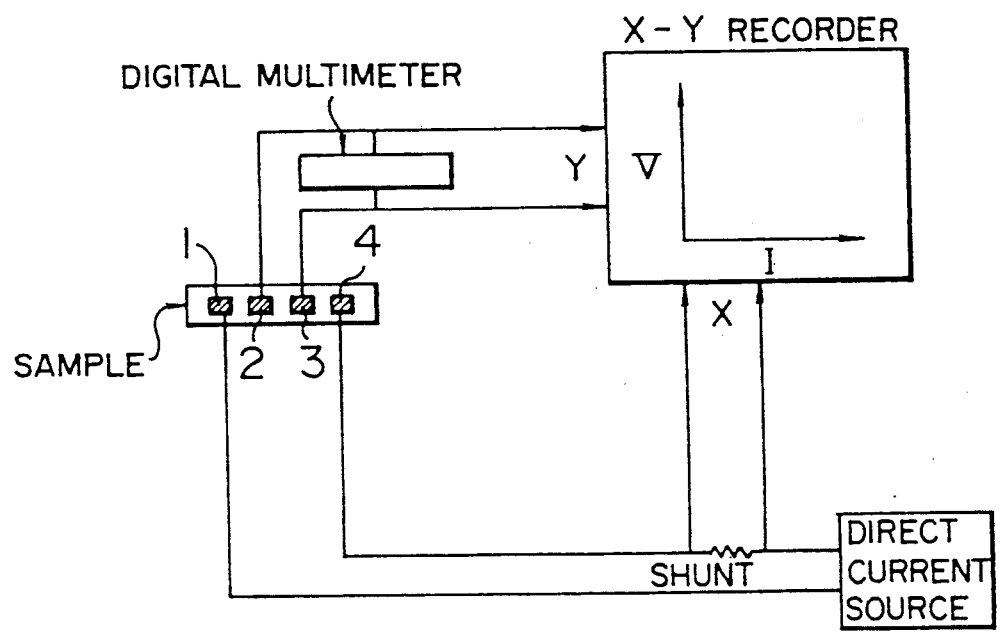
FIG. 8 is a block diagram of an apparatus for measuring Jc of high-temperature oxide superconductors in one example of the present invention.
Figure 9:
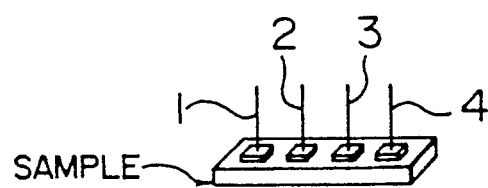
FIG. 9 is an oblique view of a sample to which copper wires are connected.

A 75 wt. % In–25 wt. % Cd alloy was placed on a strip-like $YBa_2Cu_3O_{7-\delta}$ of 15 mm in length, 4 mm in width and 1 mm in thickness and the superconductor was brazed with copper wires by heating to 180° C. under application of ultrasonic in the same manner as above to obtain four copper wire terminals as shown obliquely in FIG. 9. Terminals of both outer sides were used as current terminals and the inside two terminals were used as voltage terminals. Critical current density Jc was measured by using an apparatus as shown in FIG. 8. Current terminal 1 was connected to the positive side of a direct current source through a shunt resistor (or standard resistor) and terminal 4 was directly connected to the negative side. Voltage terminals 2 and 3 were connected to positive and negative terminals of a digital multimeter, respectively. For display of results of measurement, an X-Y recorder was used. The terminal of X side of the X-Y recorder was connected in parallel to the shunt resistor and the terminal of Y side was connected in parallel to the digital multimeter. The Jc of this sample at liquid nitrogen temperature (77° K.) and in a magnetic field of 0 was 1,250 $A/cm^2$. For comparison, terminals were formed using In as a brazing material on the same sample and the same measurement was conducted. The joint area was nearly the same as for both the samples. The Jc of this comparative sample was 160 $A/cm^2$ which was about ⅛ of that of the sample of the present invention. This is because contact resistance between superconductor and In is great and hence breakage of superconducting state due to development of heat occurs with lower current. Therefore, there is a problem in measuring true Jc value. On the other hand, it is possible to obtain measured value of high reliability by conducting evaluation of superconductor characteristics using the joining method and the brazing material of the present invention. Moreover, the fact that formation of terminals is simple is very important in evaluation of superconductor characteristics which is conducted at any time during development of superconductors.

EXAMPLE 8

Copper wires were joined to the same superconductor as used in Example 6 in the same manner as in Example 6 using a 75 wt. % Cd–25 wt. % In alloy as a brazing material. The current density of this joined body was measured to obtain the similar value to that in Example 6.

What is claimed is:

1. A high-temperature oxide superconductor on the surface of which is formed an indium alloy consisting essentially of 0.1–90% by weight of at least one divalent metallic element and the balance of indium; the metallic element being an element of Group IIA or IIB of the Periodic Table or a transition metal and the resistivity behavior of the alloy being the same as that of the oxide superconductor.

2. A high-temperature oxide superconductor wire which comprises high-temperature oxide superconductor wires per se or a high-temperature oxide superconductor wire and a metal wire which are joined by an indium alloy consisting essentially of 0.1–90% by weight of at least one divalent metallic element and the balance of indium; the metallic element being an element of Group IIA or IIB of the Periodic Table or a transition metal and the resistivity behavior of the alloy being the same as that of the oxide superconductor.

3. A high-temperature oxide superconductor article which comprises an oxide superconductor joined to another oxide superconductor or a metal conductor with an indium alloy as a solder consisting essentially of 0.1–90% by weight of at least one divalent metallic element and the balance of indium, the temperature-resistance relationship of the alloy being substantially the same as that of said oxide superconductor.

4. A high-temperature oxide superconductor article according to claim 5, wherein said article is a wire, and said superconductor and metal conductor are in a wire form.

5. A high-temperature oxide superconductor article according to claim 3, wherein said superconductor is joined at 150°–350° C. to said another oxide superconductor or said metal conductor.

6. A high-temperature oxide superconductor article according to claim 3, wherein said metallic element is an element of Group IIA or IIB of the Periodic Table or a transition metal.

7. A high-temperature oxide superconductor article according to claim 3, wherein said alloy consisting essentially of 5–75% by weight of cadmium and the balance of indium.

* * * * *